(12) United States Patent
Wang et al.

(10) Patent No.: US 12,284,882 B2
(45) Date of Patent: Apr. 22, 2025

(54) ARRAY SUBSTRATE WITH SHIELDING STRUCTURE AND MANUFACTURING METHOD THEREOF, DISPLAY PANEL AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Gang Wang, Beijing (CN); Kai Zhang, Beijing (CN); Tsanghong Wang, Beijing (CN); Erlong Song, Beijing (CN); Xingrui Cai, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 968 days.

(21) Appl. No.: 17/419,389

(22) PCT Filed: Sep. 22, 2020

(86) PCT No.: PCT/CN2020/116915
§ 371 (c)(1),
(2) Date: Jun. 29, 2021

(87) PCT Pub. No.: WO2022/061546
PCT Pub. Date: Mar. 31, 2022

(65) Prior Publication Data
US 2022/0320221 A1    Oct. 6, 2022

(51) Int. Cl.
*H10K 59/126*    (2023.01)
*H10K 59/121*    (2023.01)
(Continued)

(52) U.S. Cl.
CPC ....... *H10K 59/126* (2023.02); *H10K 59/1216* (2023.02); *H10K 59/131* (2023.02); *H10K 71/00* (2023.02); *H10K 59/1201* (2023.02)

(58) Field of Classification Search
CPC .... H10K 59/126; H10K 59/131; H10K 71/00; H10K 59/1216
(Continued)

(56) References Cited

U.S. PATENT DOCUMENTS

| 2017/0317156 A1 | 11/2017 | Kim et al. |
| 2017/0345877 A1 | 11/2017 | Hwang |
| 2020/0027939 A1 | 1/2020 | Cho et al. |

FOREIGN PATENT DOCUMENTS

| CN | 107452773 A | 12/2017 | |
| CN | 108878494 A * | 11/2018 | ......... H01L 27/3272 |

(Continued)

*Primary Examiner* — Xia L Cross
(74) *Attorney, Agent, or Firm* — ArentFox Schiff LLP; Michael Fainberg

(57) ABSTRACT

Embodiments of the present disclosure disclose an array substrate and a manufacturing method thereof, a display panel and a display device. The array substrate includes a substrate; a first metal layer located on the substrate and including a luminous control signal line; a second metal layer located on one side, departing from the substrate, of the first metal layer and including an anode overlap electrode, where the anode overlap electrode and the luminous control signal line have a first overlapping area; and a shielding structure located between the first metal layer and the second metal layer and mutually insulated from the first metal layer and the second metal layer, wherein the orthographic projection of the shielding structure on the substrate at least partially covers the orthographic projection of the first overlapping area on the substrate; and the shielding structure is coupled to a fixed potential.

12 Claims, 20 Drawing Sheets

(51) Int. Cl.
*H10K 59/131* (2023.01)
*H10K 71/00* (2023.01)
*H10K 59/12* (2023.01)

(58) Field of Classification Search
USPC .......................................................... 257/40
See application file for complete search history.

(56) References Cited

FOREIGN PATENT DOCUMENTS

| | | |
|---|---|---|
| CN | 109697958 A | 4/2019 |
| CN | 109887958 A | 6/2019 |
| CN | 110729324 A | 1/2020 |
| CN | 111463255 A | 7/2020 |
| KR | 20180062897 A | 6/2018 |

\* cited by examiner

ARRAY SUBSTRATE WITH SHIELDING STRUCTURE AND MANUFACTURING METHOD THEREOF, DISPLAY PANEL AND DISPLAY DEVICE

CROSS REFERENCES TO RELATED APPLICATIONS

The present disclosure is a US National Stage of International Application No. PCT/CN2020/116915, filed on Sep. 22, 2020, the contents of which are entirely incorporated herein by reference.

FIELD

The present disclosure relates to the field of display technology, in particular to an array substrate and a manufacturing method thereof, a display panel and a display device.

BACKGROUND

An organic light emitting diode (OLED) is one of the hotspots in the research field of current flat-panel displays. Compared with a liquid crystal display (LCD), an OLED display has advantages such as low energy consumption, low production cost, auto-luminescence, wide viewing angle and fast response. At present, the OLED display has started to replace the traditional LCD in the display fields of mobile phones, tablet personal computers, digital cameras and the like.

SUMMARY

Embodiments of the present disclosure provide an array substrate, including:
  a substrate;
  a first metal layer, located on the substrate and including a luminous control signal line;
  a second metal layer, located on one side, departing from the substrate, of the first metal layer and including an anode overlap electrode, where the anode overlap electrode and the luminous control signal line have a first overlapping area; and
  a shielding structure, located between the first metal layer and the second metal layer and mutually insulated from the first metal layer and the second metal layer; where the orthographic projection of the shielding structure on the substrate at least partially covers the orthographic projection of the first overlapping area on the substrate; and the shielding structure is coupled to a fixed potential.

In an embodiment, in the array substrate provided by the embodiments of the present disclosure, an area of the orthographic projection of the shielding structure on the substrate is 50% greater than an area of orthographic projection of the first overlapping area on the substrate.

In an embodiment, the array substrate provided by the embodiments of the present disclosure further includes a third metal layer located between the first metal layer and the second metal layer; where the shielding structure is located between the third metal layer and the second metal layer; and the shielding structure is mutually insulated from the third metal layer.

In an embodiment, the array substrate provided by the embodiments of the present disclosure further includes a third metal layer located between the first metal layer and the second metal layer; where the shielding structure is located between the third metal layer and the first metal layer; and the shielding structure is mutually insulated from the third metal layer.

In an embodiment, the array substrate provided by the embodiments of the present disclosure further includes a third metal layer located between the first metal layer and the second metal layer, where the shielding structure is located on the third metal layer.

In an embodiment, in the array substrate provided by the embodiments of the present disclosure, the second metal layer further includes a drive voltage signal line; and the third metal layer includes a capacitor plate electrically connected with the drive voltage signal line; and
  the shielding structure and the capacitor plate are an integral structure.

In an embodiment, in the array substrate provided by the embodiments of the present disclosure, the second metal layer further includes a data signal line parallel to the drive voltage signal line; the capacitor plate and the data signal line have a second overlapping area; and along an extension direction of the data signal line, a width of the second overlapping area is smaller than that of a part where the capacitor plate and the data signal line do not overlap.

In an embodiment, in the array substrate provided by the embodiments of the present disclosure, the third metal layer further includes an initialization signal line; and the shielding structure and the initialization signal line are an integral structure.

In an embodiment, the array substrate provided by the embodiments of the present disclosure further includes: an insulating layer located on one side, departing from the substrate, of the second metal layer; and an anode located on one side, departing from the substrate, of the insulating layer; and the anode is electrically connected with the anode overlap electrode by penetrating through a via hole of the insulating layer.

In an embodiment, in the array substrate provided by the embodiments of the present disclosure, the anode and the anode overlap electrode have a third overlapping area, and the third overlapping structure is a chamfering structure.

In an embodiment, in the array substrate provided by the embodiments of the present disclosure, the second metal layer further includes a drive voltage signal line; the third metal layer includes an initialization signal line, and a capacitor plate electrically connected with the drive voltage signal line; the initialization signal line and the luminous control signal line have the same extension direction; and extension directions of the drive voltage signal line and the luminous control signal line cross with each other;
  the array substrate has a plurality of sub-pixel regions; and each of the sub-pixel regions includes a first luminous control transistor and a second luminous control transistor which are electrically connected with the luminous control signal line, and a first initialization transistor and a second initialization transistor which are electrically connected with the initialization signal line; and
  both the second luminous control transistor and the second initialization transistor are electrically connected with the anode overlap electrode.

In an embodiment, in the array substrate provided by the embodiments of the present disclosure, each of the sub-pixel regions further includes a first data write transistor, a second data write transistor, a drive transistor and a storage capacitor;

a gate of the first data write transistor and a gate of the second data write transistor are both electrically connected with a first scanning line; a first electrode of the first data write transistor is electrically connected with the data signal line; a second electrode of the first data write transistor is electrically connected with a first electrode of the drive transistor; a first electrode of the second data write transistor is electrically connected with a gate of the drive transistor; a second electrode of the second data write transistor is electrically connected with a second electrode of the drive transistor;

a first electrode of the storage capacitor is the capacitor plate; a second electrode of the storage capacitor is electrically connected with the gate of the drive transistor;

a gate of the first luminous control transistor is electrically connected with the luminous control signal line; a first electrode of the first luminous control transistor is electrically connected with the drive voltage signal line; a second electrode of the first luminous control transistor is electrically connected with the first electrode of the drive transistor;

a gate of the second luminous control transistor is electrically connected with the luminous control signal line; a first electrode of the second luminous control transistor is electrically connected with the second electrode of the drive transistor; a second electrode of the second luminous control transistor is electrically connected with the anode overlap electrode;

a gate of the first initialization transistor is electrically connected with a second scanning line; a first electrode of the first initialization transistor is electrically connected with the initialization signal line; a second electrode of the first initialization transistor is electrically connected with the gate of the drive transistor; and a gate of the second initialization transistor is electrically connected with the second scanning line; a first electrode of the second initialization transistor is electrically connected with the initialization signal line; and a second electrode of the second initialization transistor is electrically connected with the anode overlap electrode.

Correspondingly, the embodiments of the present disclosure further provide a display panel, including the above array substrate provided by the embodiments of the present disclosure.

Correspondingly, the embodiments of the present disclosure further provide a display device, including the above display panel provided by the embodiments of the present disclosure.

Correspondingly, the embodiments of the present disclosure further provide a method for manufacturing the array substrate, including:

forming a first metal layer on the substrate; where the first metal layer includes a luminous control signal line;

forming a shielding structure on the substrate where the first metal layer is formed; where the shielding structure is mutually insulated from the first metal layer and coupled to a fixed potential; and forming a second metal layer on the substrate where the shielding structure is formed; where the shielding structure is mutually insulated from the second metal layer; the second metal layer includes an anode overlap electrode; the anode overlap electrode and the luminous control signal line have a first overlapping area; and the orthographic projection of the shielding structure on the substrate at least covers the orthographic projection of the first overlapping area on the substrate.

In an embodiment, the method provided by the embodiments of the present disclosure further includes: forming a drive voltage signal line on the second metal layer;

forming a third metal layer on one side, departing from the substrate, of the first metal layer before the second metal layer is formed; where the third metal layer includes a capacitor plate electrically connected with the drive voltage signal line; and forming the capacitor plate and the shielding structure by a single mask patterning process.

In an embodiment, the method provided by the embodiments of the present disclosure further includes: forming a third metal layer on one side, departing from the substrate, of the first metal layer before the second metal layer is formed, where the third metal layer includes an initialization signal line; and forming the initialization signal line and the shielding structure by a single mask patterning process.

DETAILED DESCRIPTION OF THE EMBODIMENTS

Figure 1:
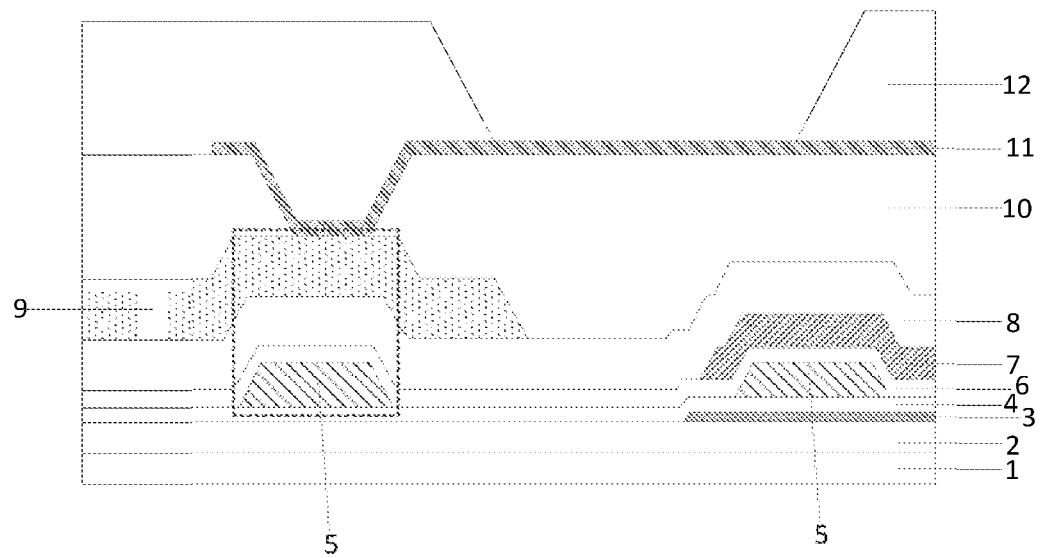
FIG. 1 is a structural schematic diagram of a section of an array substrate provided in the related art.

To make purposes, technical solutions and advantages of embodiments of the present disclosure clearer, the technical solutions of the embodiments of the present disclosure will be clearly and fully described below in combination with drawings in the embodiments of the present disclosure. Apparently, the embodiments described are merely part of embodiments of the present disclosure, rather than all the embodiments. Moreover, the embodiments in the present disclosure and features in the embodiments may be combined with one another without conflicts. Based on the described embodiments of the present disclosure, all other embodiments obtained by those ordinary skilled in the art without creative efforts fall within the protection scope of the present disclosure.

Unless otherwise defined, technical terms or scientific terms used in the present disclosure shall have general meanings that are understood by people with general skills in the field of the present disclosure. Similar words such as "comprise/include" or "contain" used in the present disclosure mean that elements or objects appearing in front of the words cover elements or objects listed behind the words and equivalents thereof, rather than excluding other elements or objects. Similar words such as "connected" or "connect" may include electrical connection, either directly or indirectly, rather than limited to physical or mechanical connection. Terms such as "inner", "outer", "upper" and "lower" are merely used for expressing relative position relations. After absolute locations of the described objects are changed, the relative position relations may also be correspondingly changed.

It shall be noted that, sizes and shapes of various figures in the drawings do not reflect true scales, and are only for the purpose of illustrating contents of the present disclosure. Moreover, the same or similar symbols throughout represent the same or similar elements or components having the same or similar functions.

An active-matrix organic light emitting diode (AMOLED) has increasingly extensive applications in the display field. Its bright and rich color display of the AMOLED is liked by more and more people. Thus, uniformity of color display becomes very important. However, since the AMOLED is a current-drive luminous device, its current is very low when a low gray scale is displayed, and moreover, color display distortion, color coordinate offset and the like are caused by parasitic capacitance and leakage paths existing among pixels, thereby severely affecting the display quality of the AMOLDE and the sensory experience of consumers.

Figure 2:
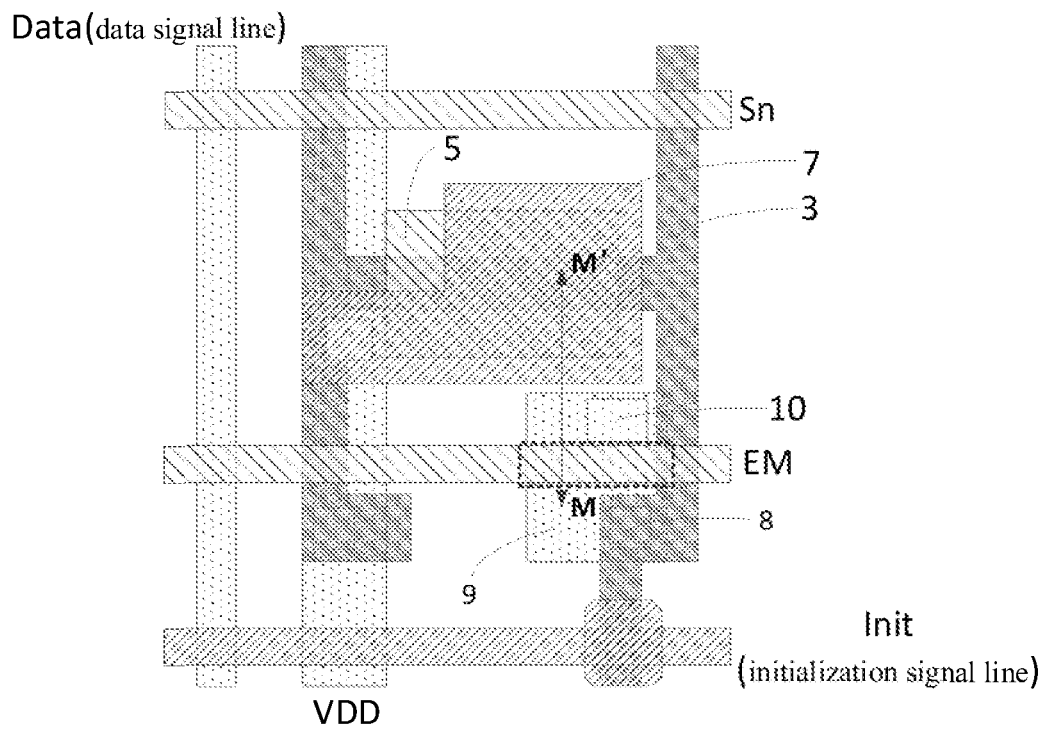
FIG. 2 is a schematic diagram of a top view structure corresponding to FIG. 1.

In the related art, for the layout design of a 7T1C pixel driving circuit, as shown in FIGS. 1 and 2, FIG. 1 is a schematic diagram of partial layout design of the 7T1C pixel driving circuit; and FIG. 2 is a structural schematic diagram of a section in a direction MM' in FIG. 1. The pixel driving circuit includes: a substrate 1, and a buffer layer 2, an active layer 3, a first insulating layer 4, a first metal layer 5, a second insulating layer 6, a third metal layer 7, a third insulating layer 8, a second metal layer 9, a fourth insulating layer 10, an anode 11, a pixel definition layer 12 and other film layers which are located on the substrate 1 and laminated in sequence. The anode 11 overlaps with the second metal layer 9 by penetrating through a via hole of the fourth insulating layer 10. The first metal layer 5 is generally provided with a luminous control line EM; and the luminous control line EM directly overlaps with the second metal layer 9 below the anode 11 to form a parasitic capacitance (shown by dotted boxes in FIGS. 1 and 2). A signal of the second metal layer 9 is a signal, i.e., the signal of the anode 11. Therefore, when an EM signal changes (when EM changes from a state "on" to a state "off"), a voltage of the second metal layer 9 rises due to the parasitic capacitance (i.e., the voltage of the anode 11 rises), thereby further causing pixel to emit light. For example, when a picture with a single color is lighted at a low gray scale, pixels with other colors will emit light, thereby causing color coordinate offset and the like. Particularly when the EM needs to be turned on or off for many times, such a problem would be exacerbated. Therefore, improving the parasitic capacitance becomes more and more important.

Figure 3:
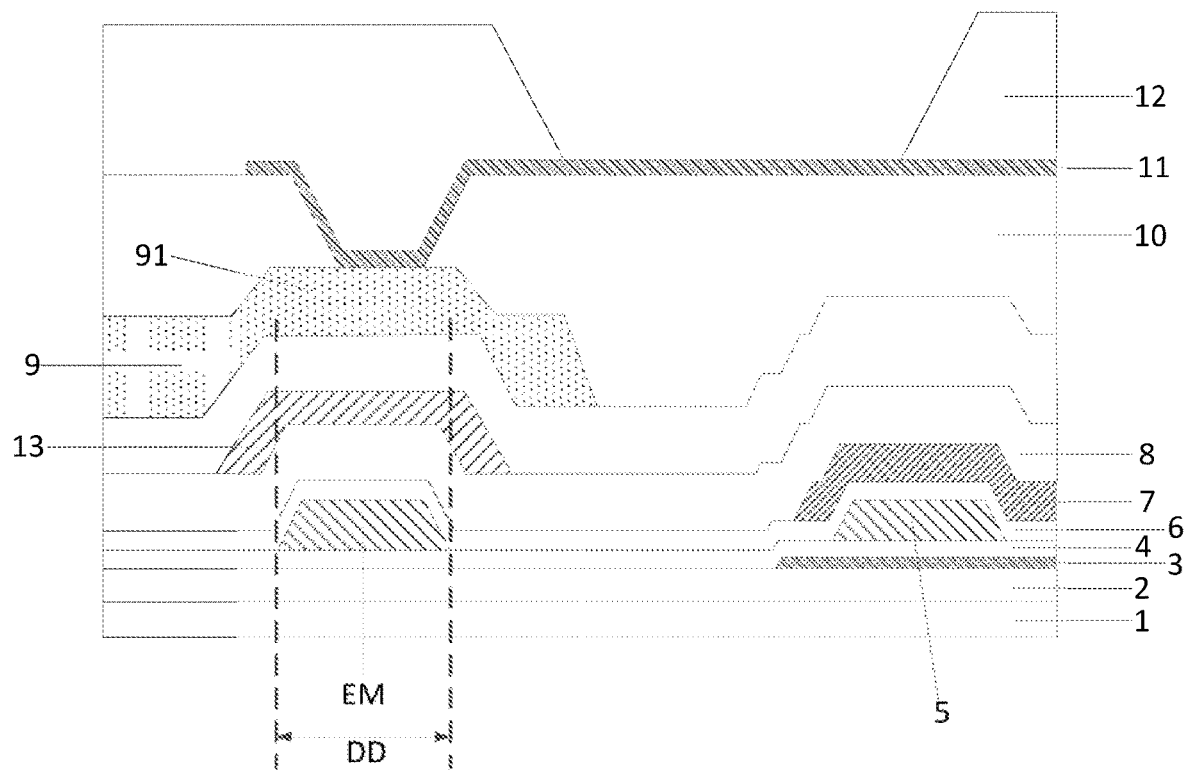
FIG. 3 is a structural schematic diagram of a section of an array substrate provided by embodiments of the present disclosure.
Figure 4:
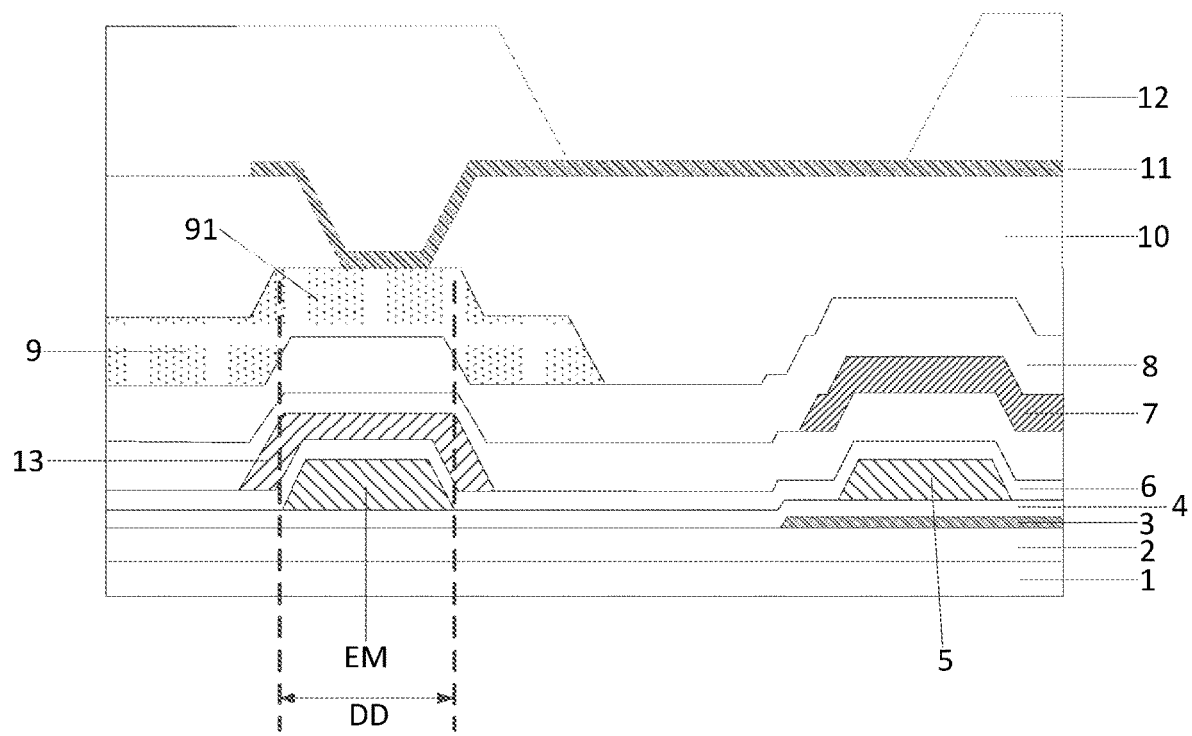
FIG. 4 is a structural schematic diagram of a section of another array substrate provided by embodiments of the present disclosure.
Figure 5:
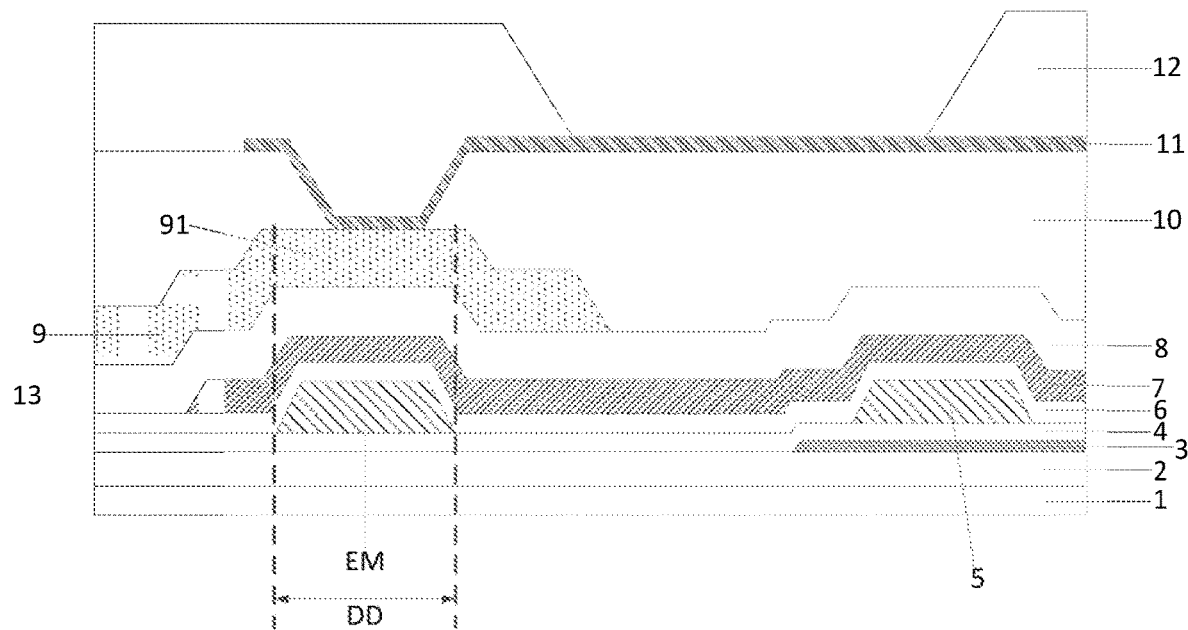
FIG. 5 is a structural schematic diagram of a section of still another array substrate provided by embodiments of the present disclosure.

In view of this, embodiments of the present disclosure provide an array substrate. As shown in FIGS. 3-5, the array substrate includes:
a substrate 1;
a first metal layer 5 located on the substrate and including a luminous control signal line EM;
a second metal layer 9, located on one side, departing from the substrate, of the first metal layer 5 and including an anode overlap electrode 91; wherein the anode overlap electrode 91 and the luminous control signal line EM have a first overlapping area DD; and
a shielding structure 13, located between the first metal layer 5 and the second metal layer 9 and mutually insulated from the first metal layer 5 and the second metal layer 9; wherein the orthographic projection of the shielding structure 13 on the substrate 1 at least partially covers the orthographic projection of the first overlapping area DD on the substrate 1; and the shielding structure 13 is coupled to a fixed potential.

According to the array substrate provided by the embodiments of the present disclosure, the shielding structure 13 which is mutually insulated from the first metal layer 5 and the second metal layer 9 is arranged between the first metal layer 5 and the second metal layer 9, and the shielding structure 13 is coupled to the fixed potential, so that the shielding structure 13 can decrease or eliminate the parasitic capacitance between the luminous control signal line EM and the anode overlap electrode 91. Moreover, voltage change of the anode electrically connected with the anode overlap electrode 91 can be avoided, thereby increasing the color display uniformity.

Specifically, the parasitic capacitance between the luminous control signal line EM and the anode overlap electrode 91 generally includes overlap capacitance and lateral capacitance between the luminous control signal line EM and the anode overlap electrode 91; and due to the shielding structure 13, the overlap capacitance and lateral capacitance can be shielded.

During specific implementation, in order to effectively decrease the parasitic capacitance between the luminous control signal line and the anode overlap electrode, in the array substrate provided by the embodiments of the present disclosure, as shown in FIG. 3, an area of the orthographic projection of the shielding structure 13 on the substrate 1 is 50% greater than an area of the orthographic projection of the first overlapping area DD on the substrate 1. The drawings in the embodiments of the present disclosure are illustrated by taking that the area of the orthographic projection of the shielding structure 13 on the substrate 1 is greater than the area of the orthographic projection of the first overlapping area DD on the substrate 1 as an example. Thus, the shielding structure 13 can shield the whole first overlapping area DD; and the parasitic capacitance between the luminous control signal line EM and the anode overlap electrode 91 completely does not affect the voltage of the anode electrically connected with the anode overlap electrode 91, thereby further increasing the color display uniformity. Certainly, during specific implementation, the area of the shielding structure 13 shall not be too large and is set according to actual needs.

During specific implementation, as shown in FIG. 3, the array substrate provided by the embodiments of the present disclosure further includes a third metal layer 7 located between the first metal layer 5 and the second metal layer 9.

The shielding structure 13 is located between the third metal layer 7 and the second metal layer 9, and the shielding structure 13 is mutually insulated from the third metal layer 7. That is, by arranging the shielding structure 13 between the third metal layer 7 and the second metal layer 9 in the embodiments of the present disclosure, an effect of shielding the parasitic capacitance between the luminous control signal line EM and the anode overlap electrode 91 can be achieved.

During specific implementation, as shown in FIG. 4, the array substrate provided by the embodiments of the present disclosure further includes a third metal layer 7 located between the first metal layer 5 and the second metal layer 9. The shielding structure 13 is located between the third metal layer 7 and the first metal layer 5, and the shielding structure 13 is mutually insulated from the third metal layer 7. That is, by arranging the shielding structure 13 between the third metal layer 7 and the first metal layer 5 in the embodiments of the present disclosure, an effect of shielding the parasitic capacitance between the luminous control signal line EM and the anode overlap electrode 91 can also be achieved.

During specific implementation, while adopting a structure shown in FIG. 3 or FIG. 4, the shielding structure 13 may be grounded.

During specific implementation, the shielding structure 13 shown in FIG. 3 and FIG. 4 is a metal layer which is separately added in the array substrate provided by the embodiments of the present disclosure. Thus, the thinning requirement of the display device cannot be facilitated. Therefore, in order to shield the parasitic capacitance between the luminous control signal line EM and the anode overlap electrode 91 on the basis of thinning the display device, as shown in FIG. 5, the array substrate provided by the embodiments of the present disclosure further includes a third metal layer 7 located between the first metal layer 5 and the second metal layer 9, and the shielding structure 13 is located on the third metal layer 7. Specifically, the first metal layer 5 is generally made into a structure such as a gate or a scanning line, etc.; and the third metal layer 7 is generally made into a storage capacitor structure of the pixel circuit in the array substrate. Thus, only an original composition pattern needs to be changed when the third metal layer 7 is formed, and then the graphs of the shielding structure 13 and the third metal layer 7 are formed by a single mask patterning process. Therefore, it is not necessary to add a process of separately preparing the shielding structure 13; preparation process flows may be simplified; production cost is saved; and production efficiency is increased.

Figure 6:
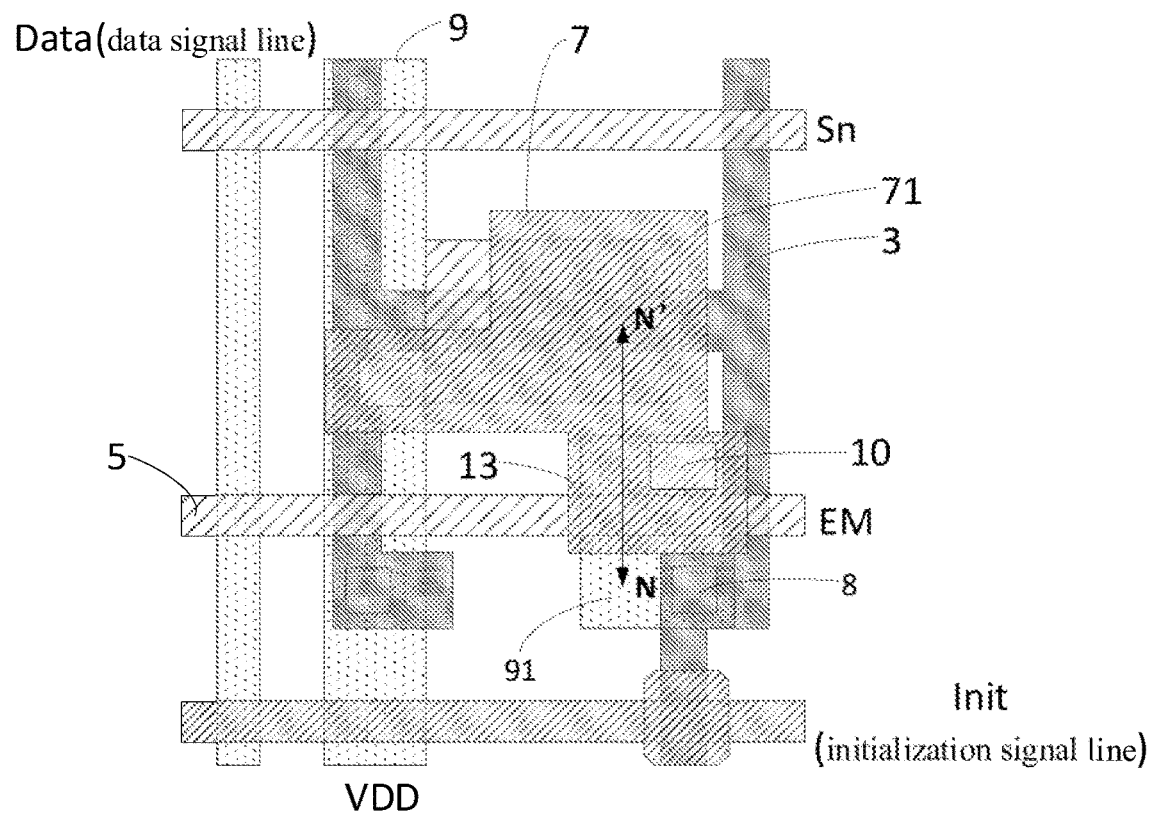
FIG. 6 is a schematic diagram of a top view structure corresponding to FIG. 5.

During specific implementation, in the array substrate provided by the embodiments of the present disclosure, as shown in FIGS. 5 and 6, FIG. 6 is a schematic diagram of a top view structure of partial film layers in an array substrate provided by the embodiments of the present disclosure. FIG. 5 is a structural schematic diagram of a section extending along a direction NN' in FIG. 6. The second metal layer 9 further includes a drive voltage signal line VDD; and the third metal layer 7 includes a capacitor plate 71 electrically connected with the drive voltage signal line VDD.

The shielding structure 13 and the capacitor plate 71 are an integral structure. Thus, only an original composition pattern needs to be changed when the capacitor plate 71 is formed, and then the graphs of the shielding structure 13 and the capacitor plate 71 are formed by a single mask patterning process. Therefore, it is not necessary to add a process of separately preparing the shielding structure 13; the preparation process flows may be simplified; the production cost is saved; and the production efficiency is increased.

Moreover, as shown in FIG. 5, when the shielding structure 13 and the capacitor plate 71 are the integral structure, it means that the area of the capacitor plate 71 is increased, so that capacitance of the drive voltage signal line VDD may be increased, thereby achieving a beneficial effect on stability of a VDD power signal.

Figure 8:
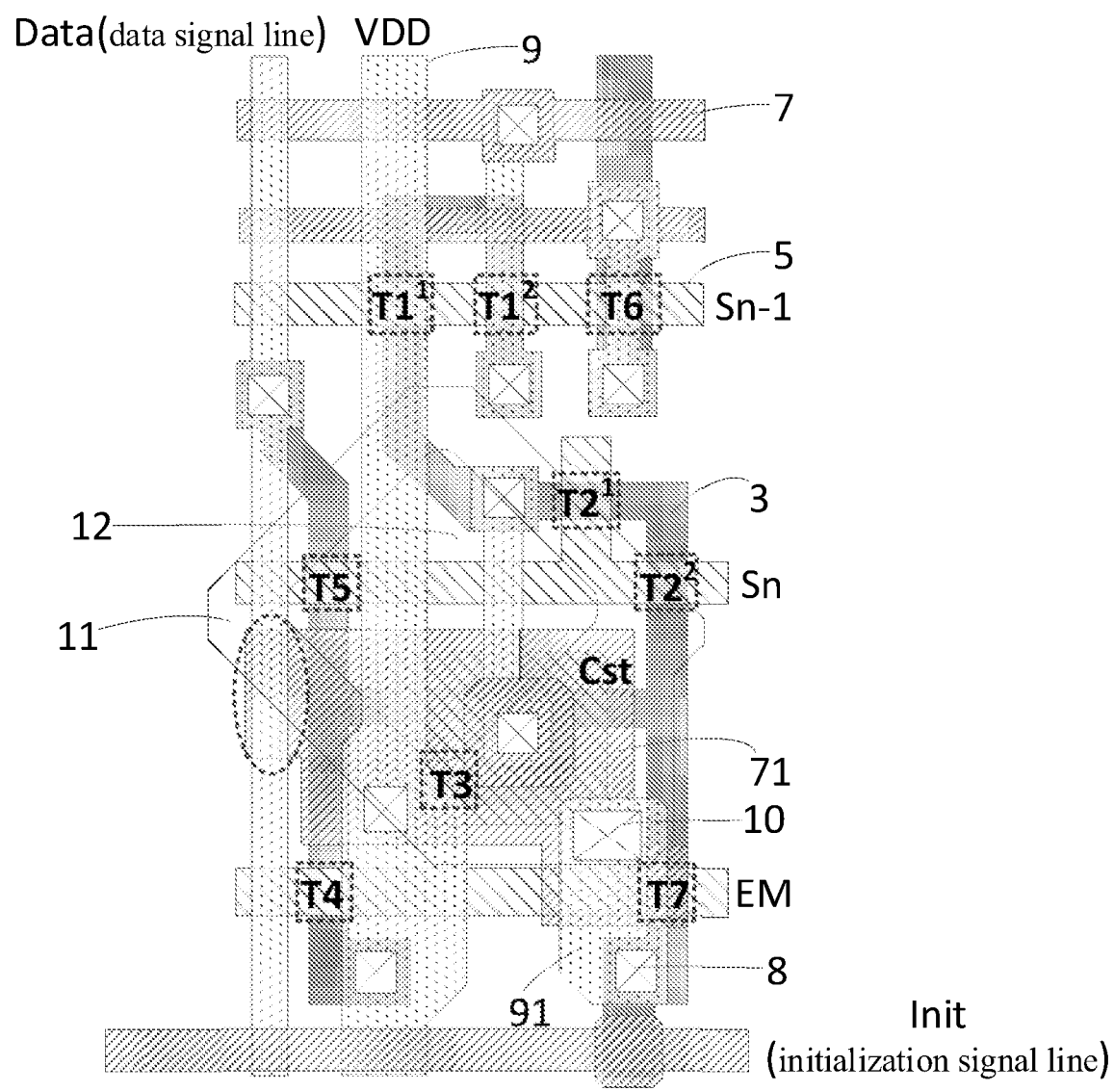
FIG. 8 is a schematic diagram of a top view structure of one sub-pixel region in an array substrate provided by embodiments of the present disclosure.

During specific implementation, in the array substrate provided by the embodiments of the present disclosure, as shown in FIG. 8, the second metal layer 9 further includes a data signal line Data parallel to the drive voltage signal line VDD. The capacitor plate 71 and the data signal line Data have a second overlapping area (an elliptical dotted box part in FIG. 8). Along an extension direction of the data signal line, a width D1 of the second overlapping area is smaller than a width D2 of a part where the capacitor plate 71 and the data signal line Data do not overlap. Specifically, since the capacitor plate 71 is electrically connected with the drive voltage signal line VDD, i.e., the signal on the capacitor plate 71 is a VDD signal, while the signal on the data signal line Data is variable. Thus, the change of the Data signal will produce interference to the VDD signal, thereby causing signal crosstalk among the pixels. Therefore, it is preferable that the capacitor plate 71 and the data signal line Data do not overlap. However, in order to ensure the stability of the VDD signal, capacitance in electrical connection with the VDD signal shall be increased. Therefore, to balance the pixel crosstalk and ensure the stability of the VDD signal, the capacitor plate 71 only partially overlaps with the data signal line Data in the extension direction of the data signal line Data.

Figure 7:
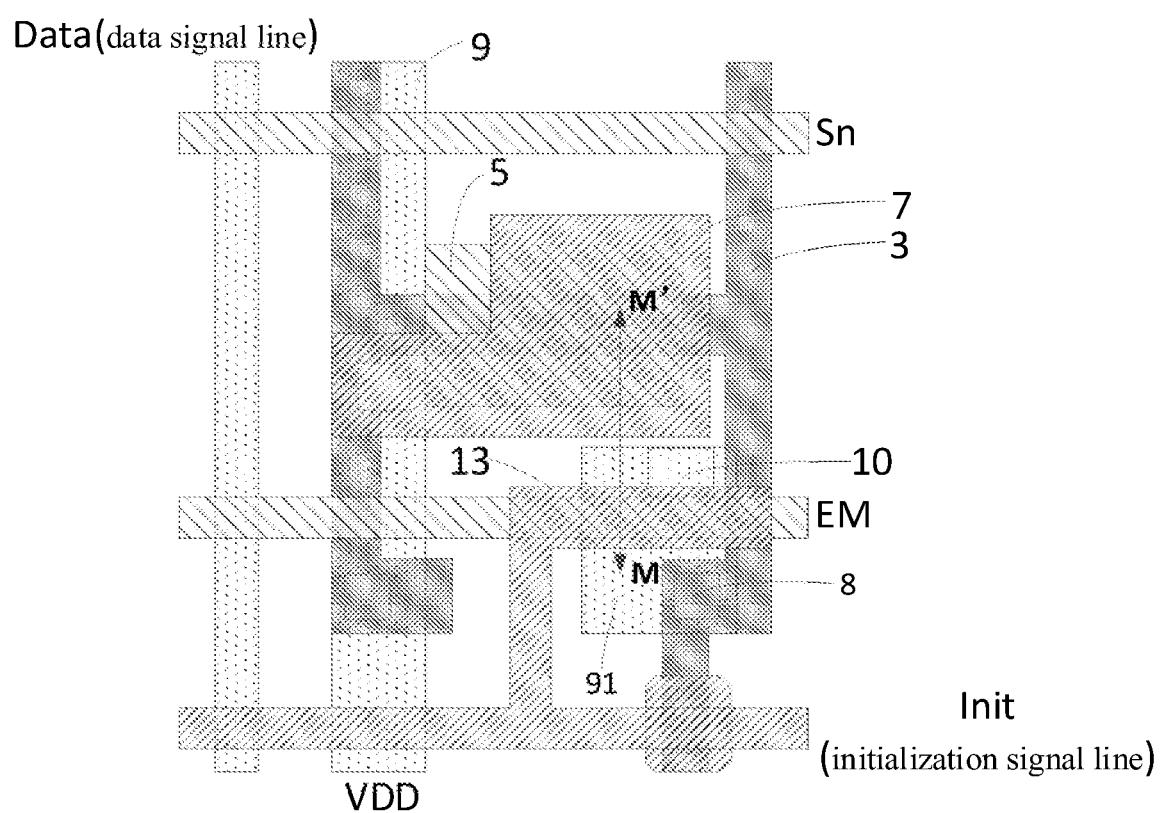
FIG. 7 is a schematic diagram of another top view structure corresponding to FIG. 5.

During specific implementation, in the array substrate provided by the embodiments of the present disclosure, as shown in FIGS. 5 and 7, FIG. 7 is a schematic diagram of a top view structure of partial film layers in the array substrate provided by the embodiments of the present disclosure. FIG. 5 is a structural schematic diagram of a section extending along a direction NN' in FIG. 7. The third metal layer 7 includes an initialization signal line Init, and the shielding structure 13 and the initialization signal line Init are an integral structure. Thus, only an original composition pattern needs to be changed when the initialization signal line Init is formed, and then the patterns of the shielding structure 13 and the initialization signal line Init are formed by a single mask patterning process. Therefore, it is not necessary to add a process of separately preparing the shielding structure 13; the preparation process flows may be simplified; the production cost is saved; and the production efficiency is increased.

During specific implementation, as shown in FIGS. 5, 6 and 7, the array substrate provided by the embodiments of the present disclosure further includes a fourth insulating layer 10 located on one side, departing from the substrate 1, of a source-drain metal layer, i.e., the second metal layer 9; and an anode 11 located on one side, departing from the substrate 1, of the fourth insulating layer 10. The anode 11 is electrically connected with the anode overlap electrode 91 by penetrating through a via hole of the fourth insulating layer 10. Since the voltage on the anode overlap electrode 91 is the same as the voltage of the anode 11, the parasitic capacitance between the luminous control signal line EM and the anode overlap electrode 91 is shielded by the shielding structure 13, i.e., the influence of the parasitic capacitance on the voltage of the anode 11 is shielded; and the color display uniformity is increased.

During specific implementation, as shown in FIG. 5, the array substrate provided by the embodiments of the present disclosure further includes: the buffer layer 2, the active layer 3 and the first insulating layer 4 which are laminated between the substrate 1 and the first metal layer 5, the second insulating layer 6 located between the first metal layer 5 and the third metal layer 7, the third insulating layer 8 located between the third metal layer 7 and the second metal layer 9, and the pixel definition layer 12 located on one side, departing from the substrate 1, of the anode 11. Certainly, the array substrate provided by the embodiments of the present disclosure further includes other functional film layers known to those skilled in the art, which are not listed one by one herein.

Specifically, the first insulating layer 4 and the second insulating layer 6 may be gate insulating layers; the third insulating layer 8 may be an interlayer insulating layer; and the fourth insulating layer 10 may be a flat layer.

It shall be indicated that, FIGS. 6 and 7 are merely schematic diagrams illustrating a local top view structure of one sub-pixel region when the shielding structure 13 is located on the third metal layer 7.

During specific implementation, in the array substrate provided by the embodiments of the present disclosure, as shown in FIG. 8, FIG. 8 is a schematic diagram of a detailed top view structure of one sub-pixel region in the array substrate provided by the embodiments of the present disclosure. Moreover, FIG. 8 is described by taking that the shielding structure and the capacitor plate are the integral structure as an example. The second metal layer 9 further includes the drive voltage signal line VDD; the third metal layer 7 includes the initialization signal line Init and the capacitor plate 71 electrically connected with the drive voltage signal line VDD. The initialization signal line Init and the luminous control signal line EM have the same extension direction; and extension directions of the drive voltage signal line VDD and the luminous control signal line EM cross with each other.

Specifically, as shown in FIG. 8, by taking that one sub-pixel region includes the 7T1C pixel circuit as an example in FIG. 8, when the 7T1C pixel circuit is manufactured, the active layer 3, the first metal layer 5, the second metal layer 7, the third insulating layer 8, the second metal layer 9, the fourth insulating layer 10, the anode 11, the pixel definition layer 12 and other patterns need to be manufactured on the substrate 1 in sequence; and the schematic diagrams of the top view structures of the various film layers are respectively shown in FIGS. 9A-9H.

Figure 9A:
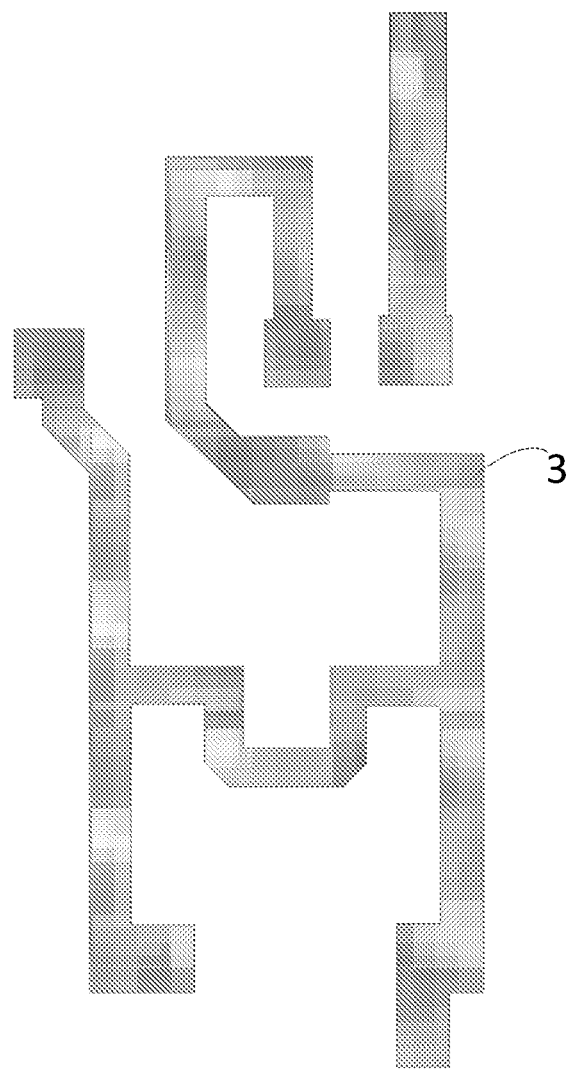
FIGS. 9A-9H are respectively schematic diagrams of top view structures of various film layers corresponding to FIG. 8.
Figure 9B:
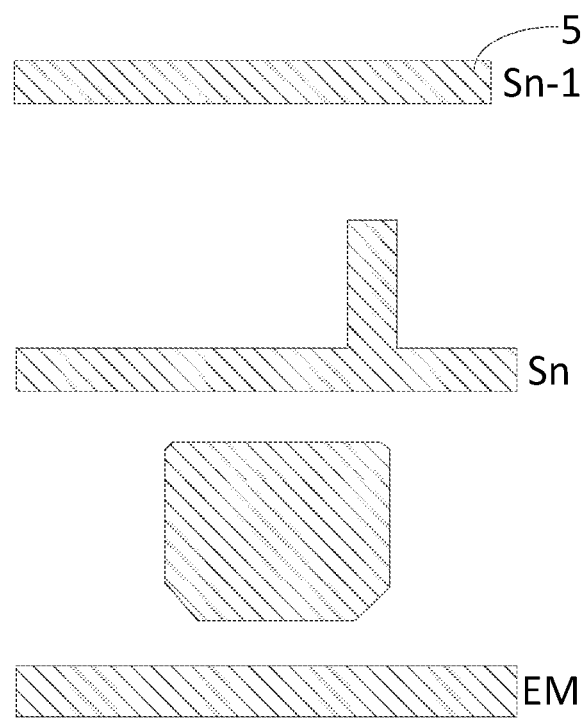
Figure 9C:
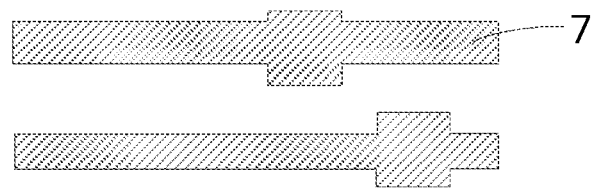
Figure 9C:
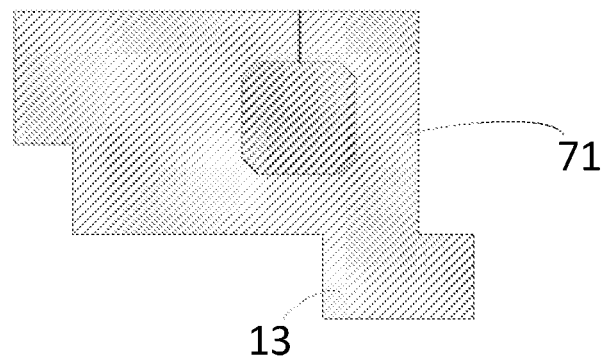
Figure 9D:
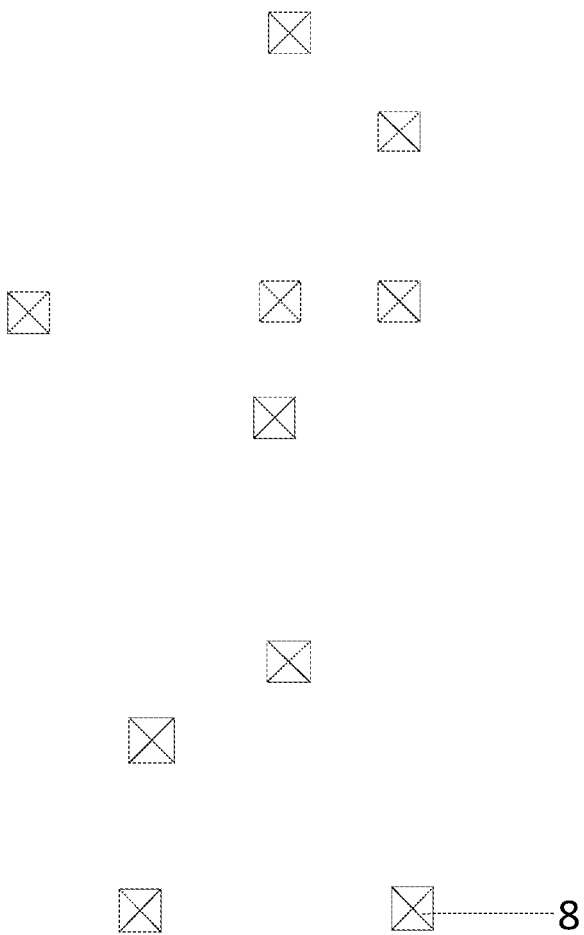
Figure 9E:
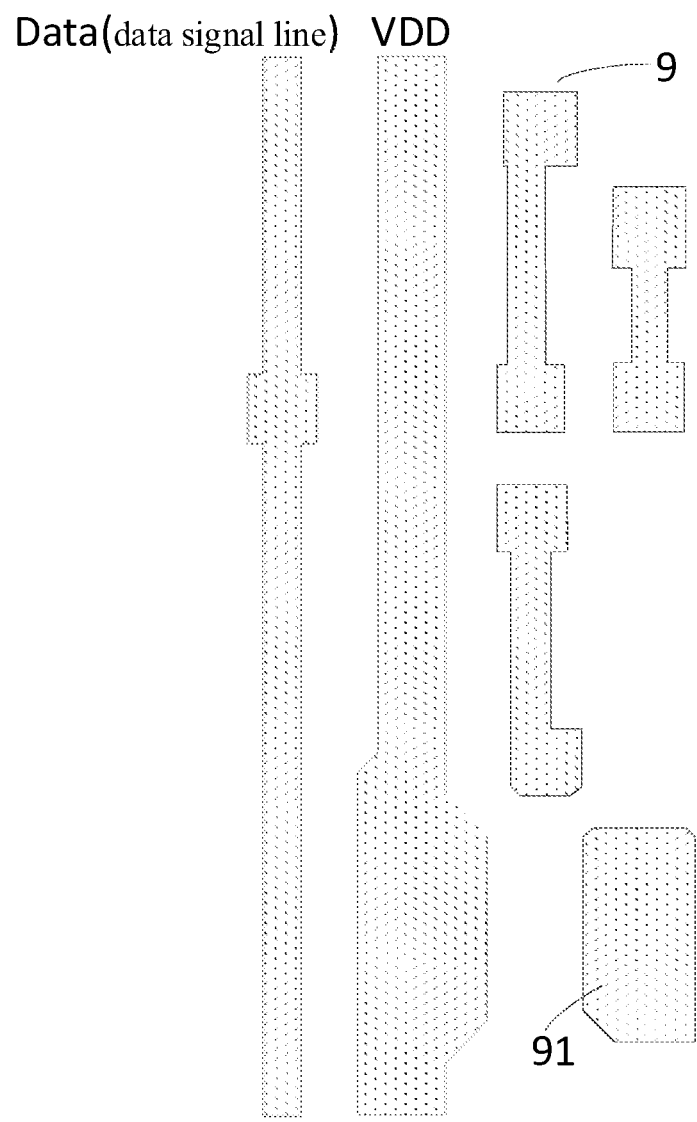
Figure 9F:
Figure 9G:
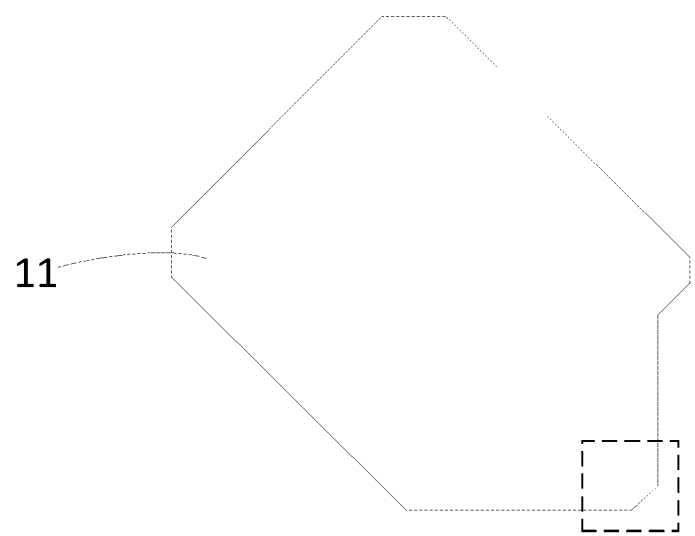
Figure 9H:
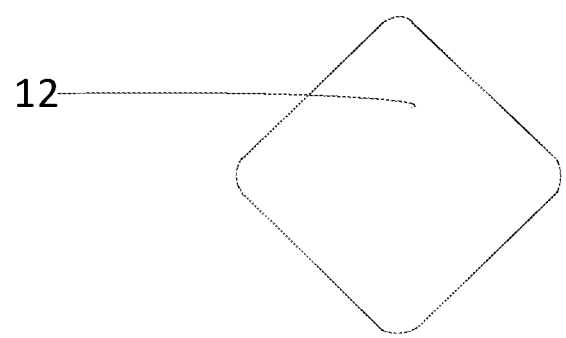

It shall be indicated that, FIG. 9D illustrates a via hole region of the third insulating layer 8; FIG. 9F illustrates a via hole region of the fourth insulating layer 10; and FIG. 9H illustrates an opening area of the pixel definition layer 12.

It shall be indicated that, FIGS. 9A-9H merely illustrate top view schematic diagrams of major film layers in the sub-pixel regions. Certainly, each of the sub-pixel regions further includes the buffer layer 2, the first insulating layer 4, the second insulating layer 6 and other film layer structures.

During specific implementation, as shown in FIG. 8, the anode overlap part 91 does not overlap with the gate of a drive transistor T3. As shown in FIGS. 8 and 9G, the anode 11 and the anode overlap electrode 91 have a third overlapping area (a dotted box part in FIG. 9G); and the third overlapping area is a chamfering structure. Thus, the third overlapping area is prevented from being set as a sharp angle, so as to be favorable for decreasing electrostatic injury during mask process manufacture.

Figure 10:
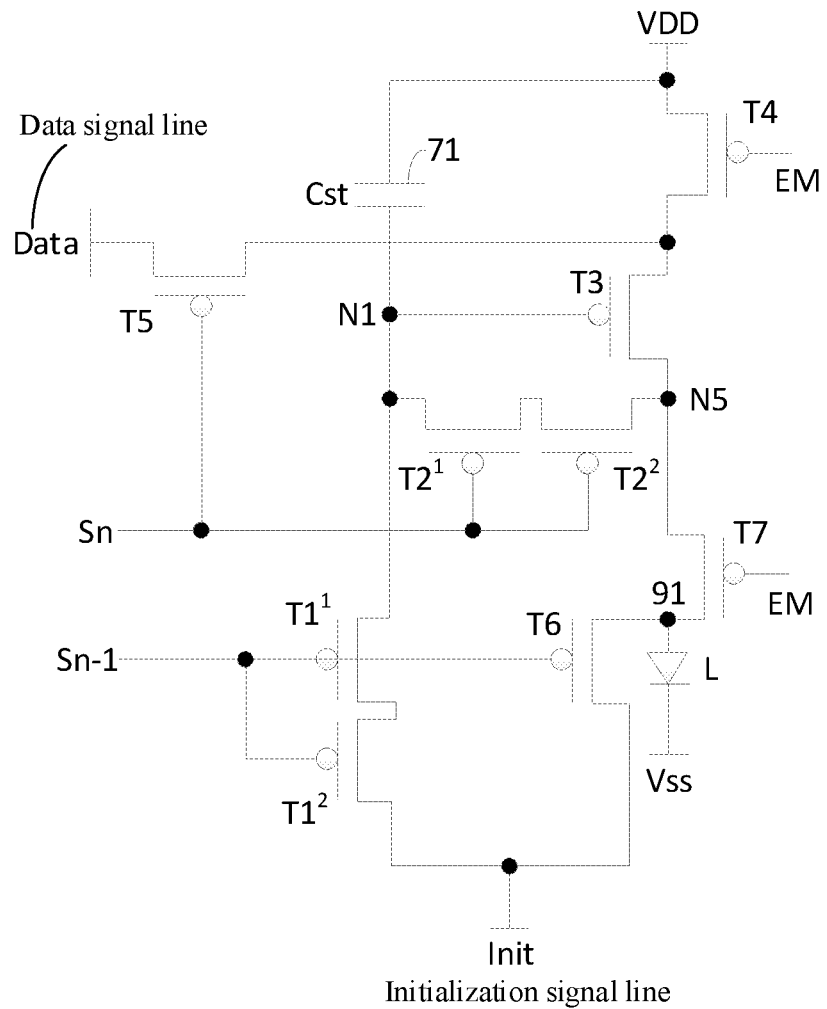
FIG. 10 is a schematic diagram of an equivalent circuit of a pixel driving circuit corresponding to FIG. 8.

During specific implementation, as shown in FIGS. 8, 9A and 10, the active layer 3 has a "U"-shaped area. The capacitor plate 71 covers the "U"-shaped area and the active layer 3 on the left of the "U"-shaped area. The structure of the capacitor plate 71 is intended to shield interference of the data line Data on the source of the drive transistor T3, so as to solve a problem that the source of the drive transistor T3 is unstable due to the influence of a high-frequency Data signal to cause poor display. In addition, the capacitor plate 71 may partially cover the active layer on the right of the "U"-shaped area, and the coverage area is 50% less than the area of the active layer on the right of the "U"-shaped area. The capacitor plate 71 at least partially overlaps with the second electrode of the drive transistor T3, thereby decreasing coupling capacitance formed between the second electrode of the drive transistor T3 and the VDD and further decreasing the risk that a black picture is relatively bright due to the increased anode voltage. Specifically, the second electrode of the drive transistor T3 may be a drain.

During specific implementation, the "U"-shaped area of the active layer 3 in FIG. 9A may be S-shaped, H-shaped or other shapes. The shape may be designed according to actual needs. Specific shapes are not limited in the present disclosure.

It shall be indicated that, the "left" and "right" above are only described with respect to the drawings in the embodiments of the present disclosure, and certainly, the "left" and "right" may change along with the change of the layout change or signal transmission direction.

During specific implementation, as shown in FIG. 8, the drive voltage signal line VDD is set into a structure that is narrowed from bottom to top, thereby ensuring layout uniformity of the array substrate, i.e., ensuring distance consistency of metals on the same layer between lines.

Specifically, as shown in FIGS. 8 and 10, FIG. 10 is a structural schematic diagram of an equivalent circuit of a pixel driving circuit corresponding to FIG. 8. The array substrate is provided with a plurality of sub-pixel regions (only one sub-pixel region is illustrated in the present disclosure); each of the sub-pixel regions includes a first luminous control transistor T4 and a second luminous control transistor T7 which are electrically connected with the luminous control signal line EM, and a first initialization transistor T1 and a second initialization transistor T6 that are electrically connected with the initialization signal line Init; and both the second luminous control transistor T7 and the second initialization transistor T6 are electrically connected with the anode overlap electrode 91.

During specific implementation, in the array substrate provided by the embodiments of the present disclosure, as shown in FIGS. 8 and 10, each of the sub-pixel regions further includes: a first data write transistor T5, a second data write transistor T2, a drive transistor T3 and a storage capacitor Cst;

a gate of the first data write transistor T5 and a gate of the second data write transistor T2 are both electrically connected with a first scanning line Sn; a first electrode of the first data write transistor T5 is electrically connected with the data signal line Data; a second electrode of the first data write transistor T5 is electrically connected with a first electrode of the drive transistor T3;

a first electrode of the second data write transistor T2 is electrically connected with a gate of the drive transistor T3; a second electrode of the second data write transistor T2 is electrically connected with a second electrode of the drive transistor T3;

a first electrode of the storage capacitor Cst is the capacitor plate 91; a second electrode of the storage capacitor Cst is electrically connected with the gate of the drive transistor T3; specifically, as shown in FIG. 8, the capacitor plate 91 of the storage capacitor Cst and the shielding structure 13 are an integral structure;

a gate of the first luminous control transistor T4 is electrically connected with the luminous control signal line EM; a first electrode of the first luminous control transistor T4 is electrically connected with the drive voltage signal line VDD; a second electrode of the first luminous control transistor T4 is electrically connected with the first electrode of the drive transistor T3;

a gate of the second luminous control transistor T7 is electrically connected with the luminous control signal line EM; a first electrode of the second luminous control transistor T7 is electrically connected with the second electrode of the drive transistor T3; a second electrode of the second luminous control transistor T7 is electrically connected with the anode overlap electrode 91;

a gate of the first initialization transistor T1 is electrically connected with a second scanning line Sn-1; a first electrode of the first initialization transistor T1 is electrically connected with the initialization signal line Init; a second electrode of the first initialization transistor T1 is electrically connected with the gate of the drive transistor T3; and a gate of the second initialization transistor T6 is electrically connected with the second scanning line Sn-1; a first electrode of the second initialization transistor T6 is electrically connected with the initialization signal line Init; and a second electrode of the second initialization transistor T6 is electrically connected with the anode overlap electrode 91.

Specifically, the thin film transistor (TFT) included in each of the sub-pixel regions is generally an oxide transistor (an Oxide TFT). The film layer where the shielding structure is located provided by the embodiments of the present disclosure may serve as a gate or source-drain of the Oxide TFT, and may also serve as a shading layer of the oxide TFT. This is not limited herein in the present disclosure.

During specific implementation, in the array substrate provided by the embodiments of the present disclosure, as shown in FIG. 10, each of the sub-pixel regions further includes a luminescent device L electrically connected with the anode overlap electrode 91. The 7T1C pixel driving circuit composed of T1-T7 is used for driving the luminescent device L to emit light.

During specific implementation, since the drive transistor is used for outputting stable current to drive the luminescent device to emit light, the stability of grid voltage of the drive transistor is vitally important. Thus, leakage current between the gate of the drive transistor and the storage capacitor needs to be decreased. Therefore, in order to decrease the leakage current between the gate of the drive transistor and the storage capacitor, in the array substrate provided by the embodiments of the present disclosure, as shown in FIGS. 8 and 10, both the first initialization transistor T1 and the second data write transistor T2 are dual-gate transistors. Specifically, the first initialization transistor T1 includes a first initialization sub-transistor $T1^1$ and a second initialization sub-transistor $T1^2$ connected in series; and the second data write transistor T2 includes a first data write sub-transistor $T2^1$ and a second data write sub-transistor $T2^2$ connected in series.

It shall be indicated that, a principle of driving the luminescent device L to emit light by the pixel driving circuit shown in FIGS. 8 and 10 is the same as that in the related art except that the capacitor plate 71 of the storage capacitor Cst and the shielding structure 13 are made into an integral structure, i.e., it is equivalent to that the patterning process is changed to enlarge a pattern of the capacitor plate 71 when the capacitor plate 71 is manufactured. Thus, the enlarged part covers the first overlapping area DD between the anode overlap electrode 91 and the luminous control signal line EM; and the enlarged part is the shielding structure 13, thereby achieving an effect of shielding the parasitic capacitance formed between the anode overlap electrode 91 and the luminous control signal line EM and increasing the color display uniformity.

During specific implementation, the array substrate generally includes a plurality of sub-pixel regions with different colors, such as red sub-pixels, green sub-pixels and blue sub-pixels. When the shielding structure is set, shielding structures that are correspondingly arranged in the sub-pixel regions with different colors may have the same or different shapes, or the sub-pixels with some colors may be not provided with the shielding structure. Specifically, a position of the shielding structure may be set based on actual needs.

Figure 11:
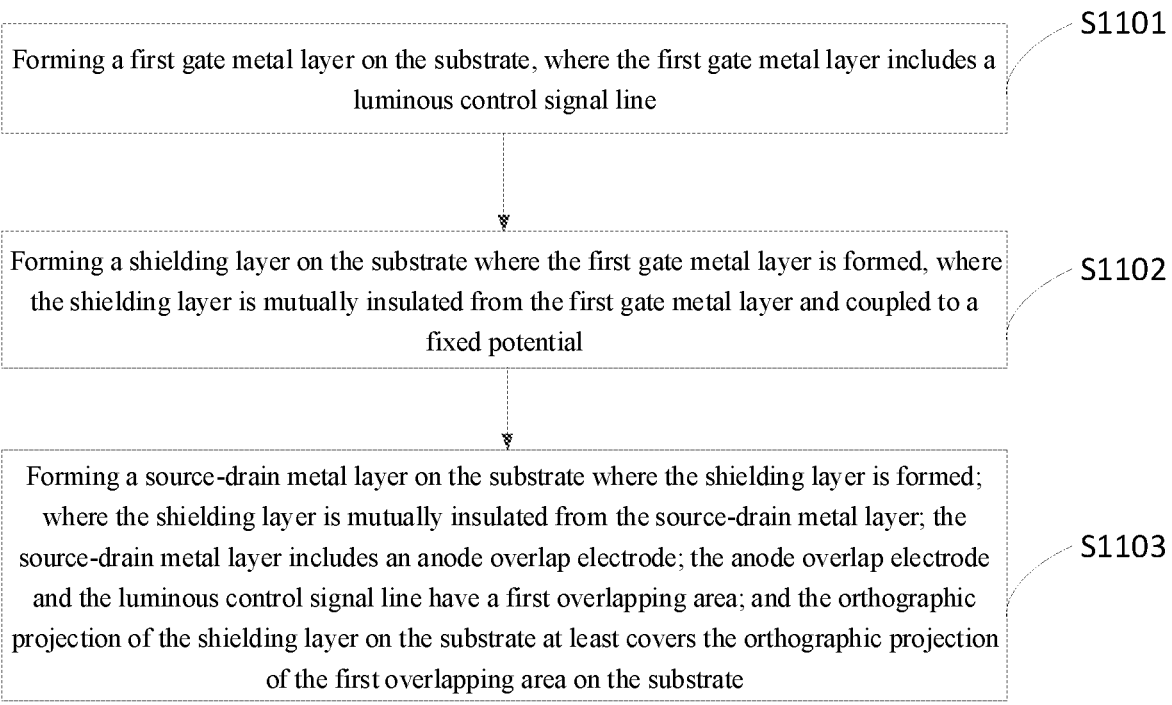
FIG. 11 is a flow diagram of a method for manufacturing an array substrate provided by embodiments of the present disclosure.

Based on the same inventive concept, the embodiments of the present disclosure further provide a method for manufacturing an array substrate. As shown in FIG. 11, the method includes:

S1101, forming a first metal layer on a substrate; where the first metal layer includes a luminous control signal line;

S1102, forming a shielding structure on the substrate where the first metal layer is formed; where the shielding structure is mutually insulated from the first metal layer and coupled to a fixed potential; and S1103, forming a second metal layer on the substrate where the shielding structure is formed; where the shielding structure is mutually insulated from the second metal layer; the second metal layer includes an anode overlap electrode; the anode overlap electrode and the luminous control signal line have a first overlapping area; and the orthographic projection of the shielding structure on the substrate at least covers the orthographic projection of the first overlapping area on the substrate.

According to the method for manufacturing the array substrate provided by the embodiments of the present disclosure, the shielding structure which is mutually insulated from the first metal layer and the second metal layer is arranged between the first metal layer and the second metal layer, and the shielding structure is coupled to the fixed potential, so that the parasitic capacitance between the luminous control signal line and the anode overlap electrode can be decreased or eliminated; and the voltage change of the anode electrically connected with the anode overlap electrode can be avoided, thereby increasing the color display uniformity.

During specific implementation, the method for manufacturing the array substrate provided by the embodiments of the present disclosure further includes: forming a drive voltage signal line on the second metal layer;

forming a third metal layer on one side, departing from the substrate, of the first metal layer before the second metal layer is formed; where the third metal layer includes a capacitor plate electrically connected with the drive voltage signal line; and forming the capacitor plate and the shielding structure by a single mask patterning process. Thus, only an original composition pattern needs to be changed when the capacitor plate is formed, and then the patterns of the shielding structure and the capacitor plate are formed by the single mask patterning process. Therefore, it is not necessary to add a process of separately preparing the shielding structure; preparation process flows may be simplified; production cost is saved; and production efficiency is increased.

During specific implementation, the method provided by the embodiments of the present disclosure further includes: forming a third metal layer on one side, departing from the substrate, of the first metal layer before the second metal layer is formed; where the third metal layer includes an initialization signal line; and forming the initialization signal line and the shielding structure by a single mask patterning process. Thus, only an original composition pattern needs to be changed when the initialization signal line is formed, and then the patterns of the shielding structure and the initialization signal line are formed by the single mask patterning process. Therefore, it is not necessary to add the process of separately preparing the shielding structure; the preparation process flows may be simplified; the production cost is saved; and the production efficiency is increased.

Specifically, an implementation principle of the shielding structure in the method for manufacturing the array substrate provided by the embodiments of the present disclosure refers to an implementation principle of the shielding structure in the above array substrate. Unnecessary details are not given herein.

The method for manufacturing the array substrate shown in FIG. 8 provided by the embodiments of the present disclosure will be described below, and specifically includes the following steps.

Figure 12A:
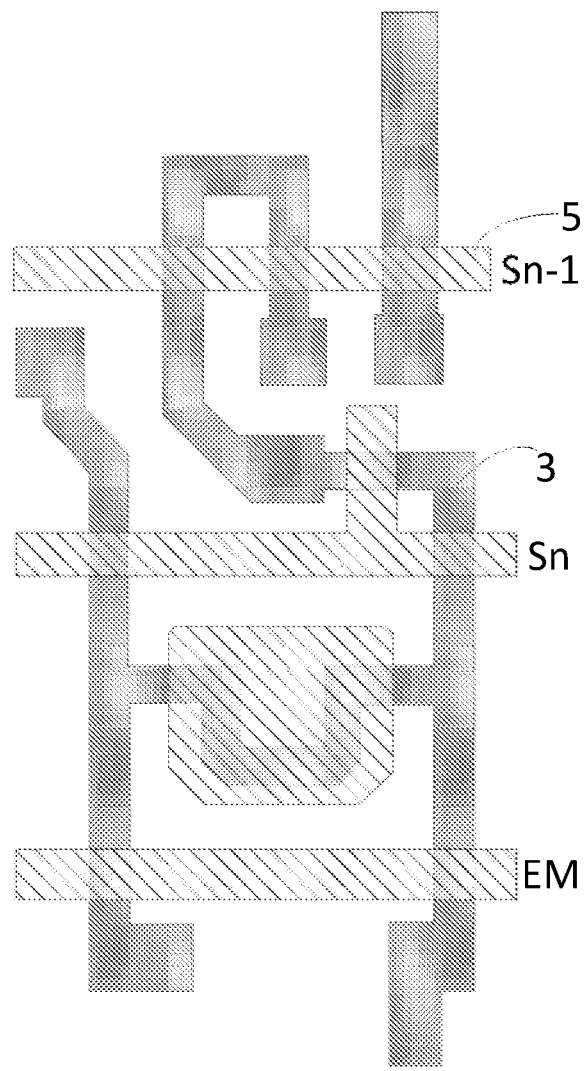
FIGS. 12A-12F are respectively schematic diagrams of top view structures after executing various steps of manufacturing the array substrate shown in FIG. 8.

(1) A pattern of the active layer 3 on the substrate is manufactured; and at least the pattern of the first metal layer 5 on the active layer 3 is manufactured, as shown in FIG. 12A.

Figure 12B:
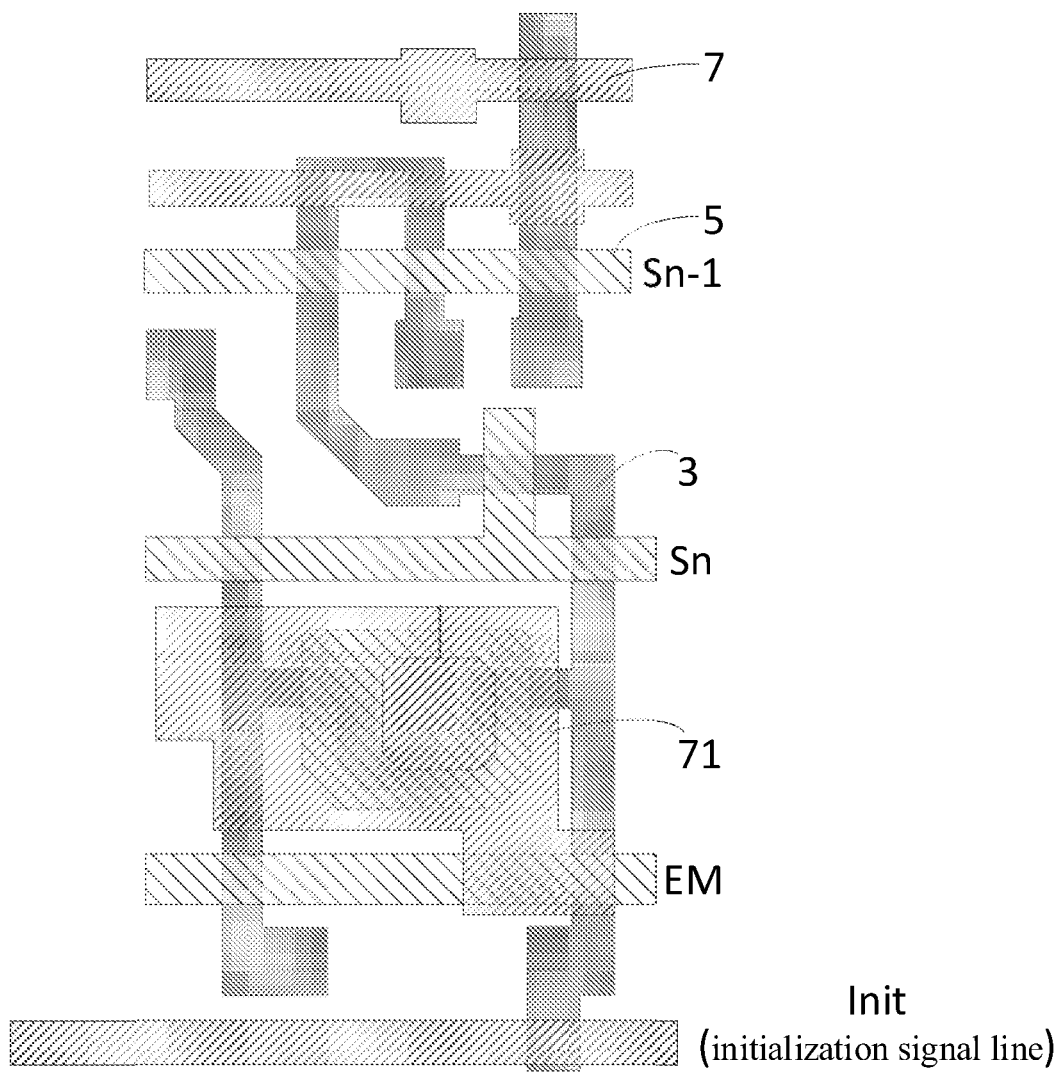

(2) A pattern of the third metal layer 7 on the first metal layer 5 is manufactured; and the patterns of the shielding structure 13 and the capacitor plate 71 are formed by a single mask patterning process, as shown in FIG. 12B.

Figure 12C:
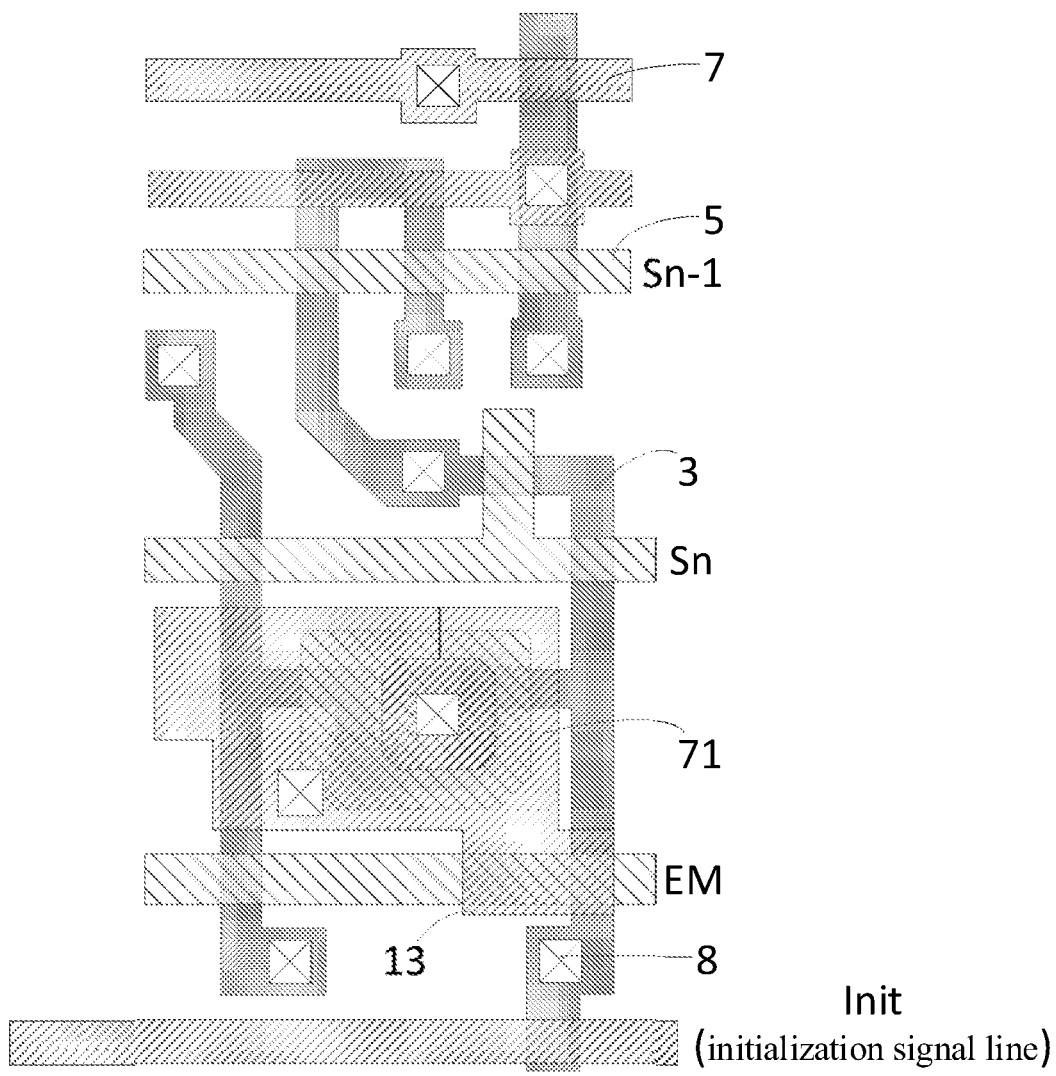

(3) A pattern of the third insulating layer 8 on the third metal layer 7 is manufactured, as shown in FIG. 12C.

Figure 12D:
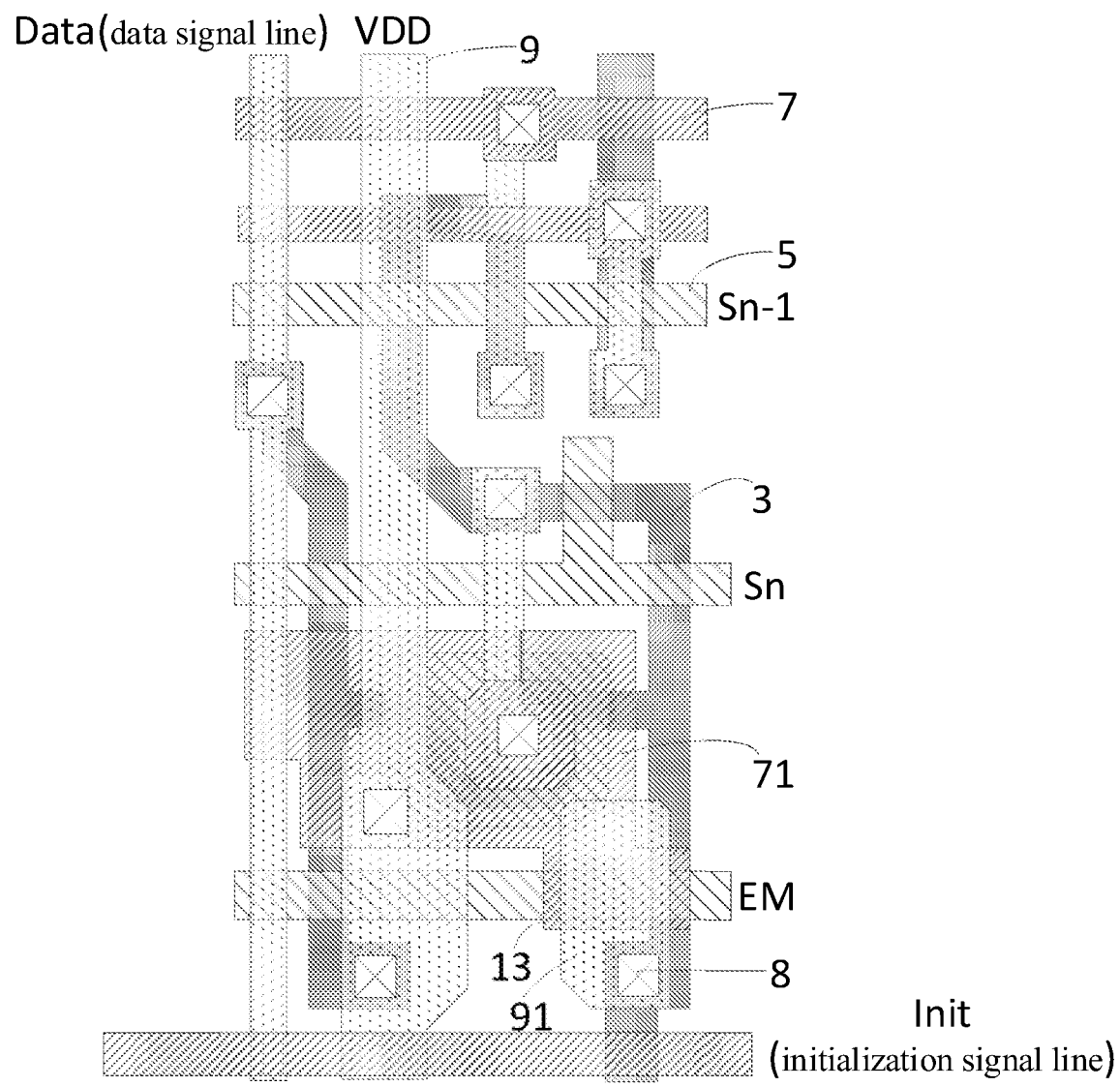

(4) A pattern of the second metal layer 9 on the third insulating layer 8 is manufactured, as shown in FIG. 12D.

Figure 12E:
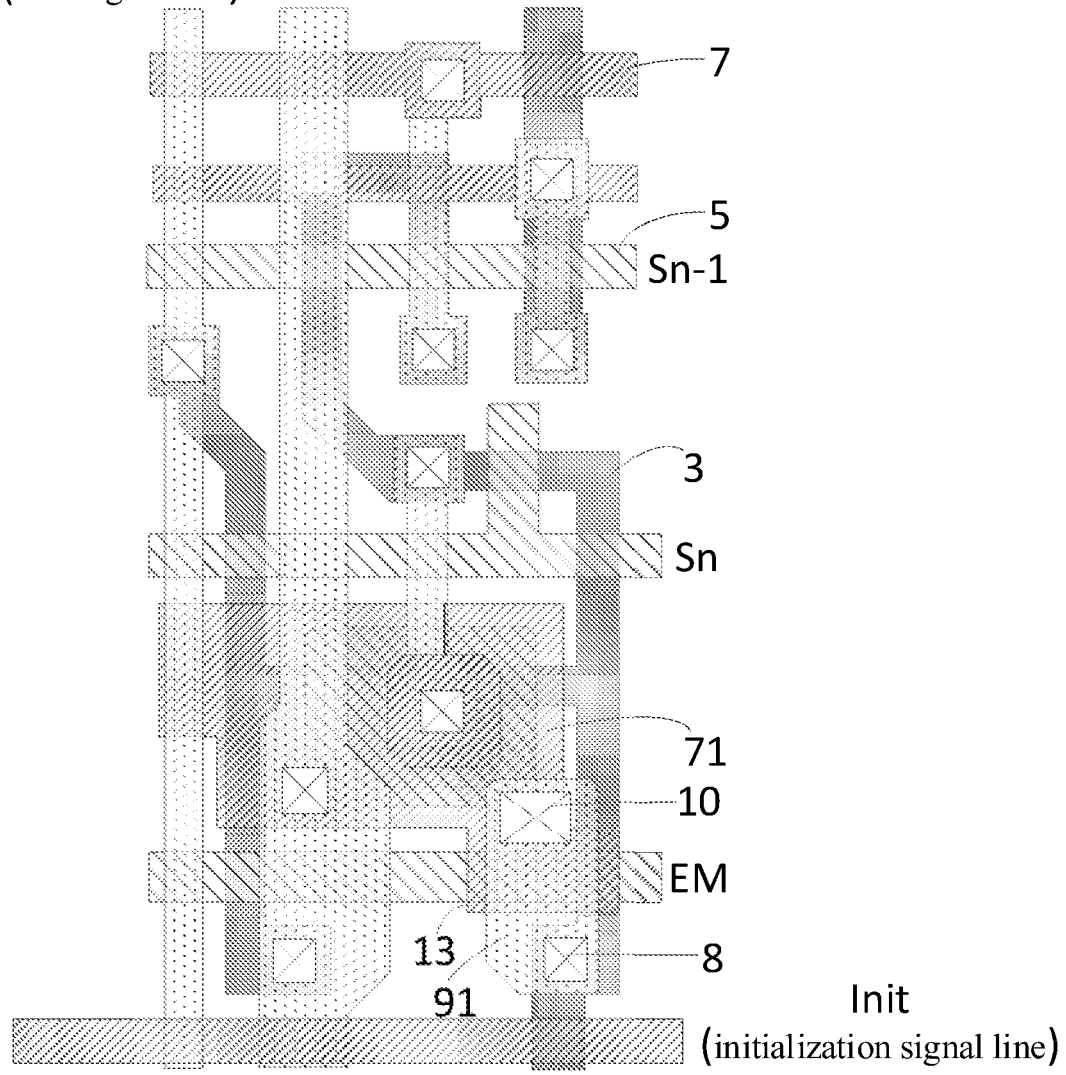

(5) A pattern of the fourth insulating layer 10 on the second metal layer 9 is manufactured, as shown in FIG. 12E.

Figure 12F:
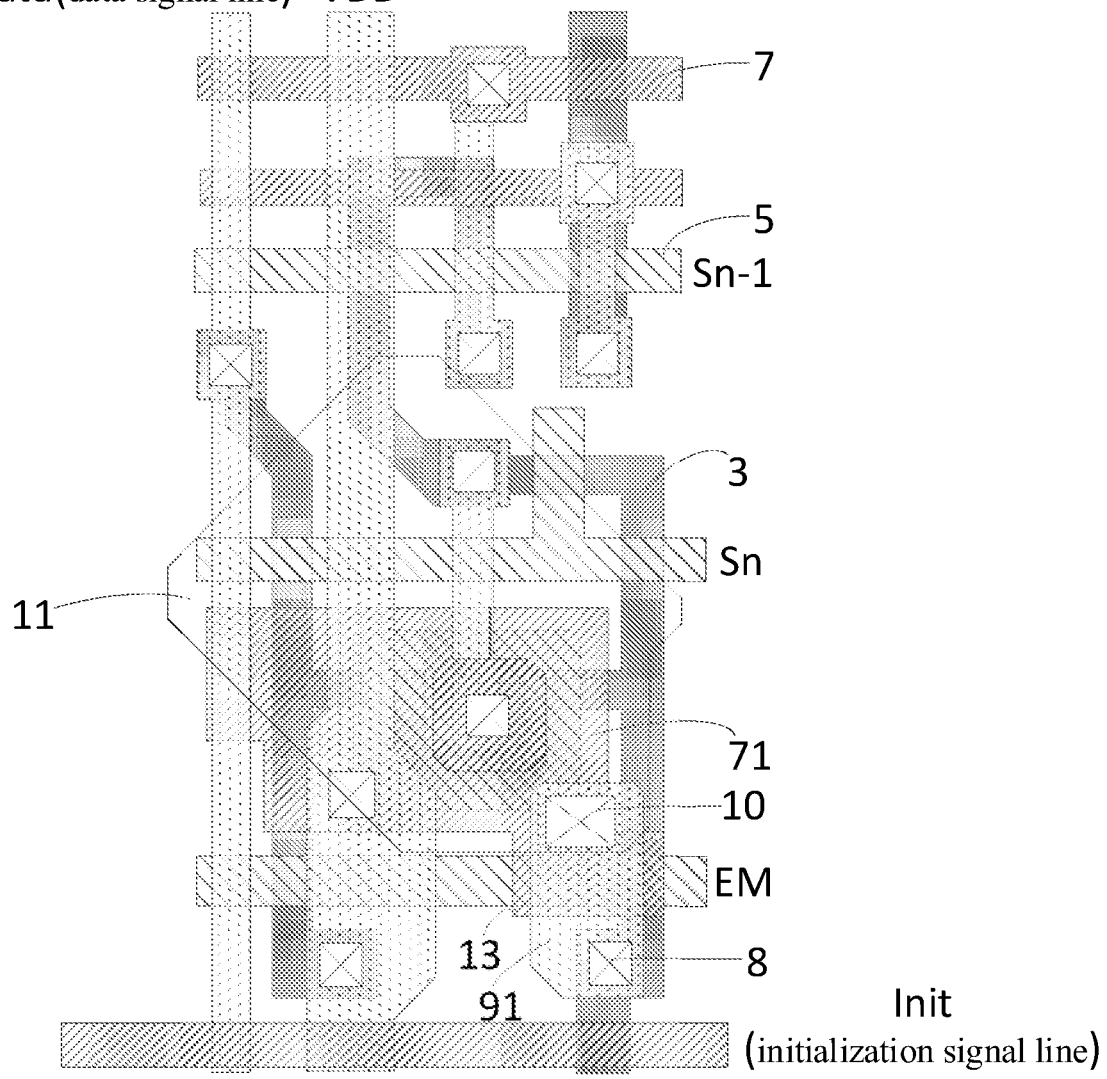

(6) A pattern of the anode 11 on the fourth insulating layer 10 is manufactured, as shown in FIG. 12F.

(7) A pattern of the pixel definition layer 12 on the anode 11 is manufactured, as shown in FIG. 8.

The array substrate shown in FIG. 8 provided by the embodiments of the present disclosure may be manufactured by the steps (1) to (7).

It shall be indicated that, the steps (1) to (7) merely illustrate schematic diagrams of manufacturing major film layers, and certainly further include manufacturing the buffer layer 2, the first insulating layer 4, the second insulating layer 6 and other film layer structures.

It shall be indicated that, in the method for manufacturing the array substrate provided by the embodiments of the present disclosure, the various film layers may be manufactured by the patterning process. Specifically, the patterning process may only include a lithography process, or may include the lithography process and an etching step, and may further include other processes, such as printing and inkjet, used for forming preset patterns. The lithography process refers to a process of forming the pattern by utilizing photoresist, a mask or an exposure machine, including process procedures such as film forming, exposure and developing. During specific implementation, corresponding patterning processes may be selected according to the structure formed in the present disclosure.

Based on the same inventive concept, the embodiments of the present disclosure further provide a display panel. The display panel includes the array substrate provided by the embodiments of the present disclosure. A principle of the display panel for solving problems is similar to that of the above array substrate. Therefore, implementation of the display panel may refer to implementation of the above array substrate. Unnecessary details of the repeated part are not given herein.

During specific implementation, the display panel provided by the embodiments of the present disclosure is an organic light-emitting display panel.

Based on the same inventive concept, the embodiments of the present disclosure further provide a display device, including the display panel provided by the embodiments of the present disclosure. A principle of the display device for solving problems is similar to that of the above array substrate. Therefore, implementation of the display device may refer to implementation of the above array substrate. Unnecessary details of the repeated part are not given herein.

During specific implementation, the display device provided by the embodiments of the present disclosure may be a full-screen display device or may be a flexible display device or the like. The display device is not limited herein.

Figure 13:
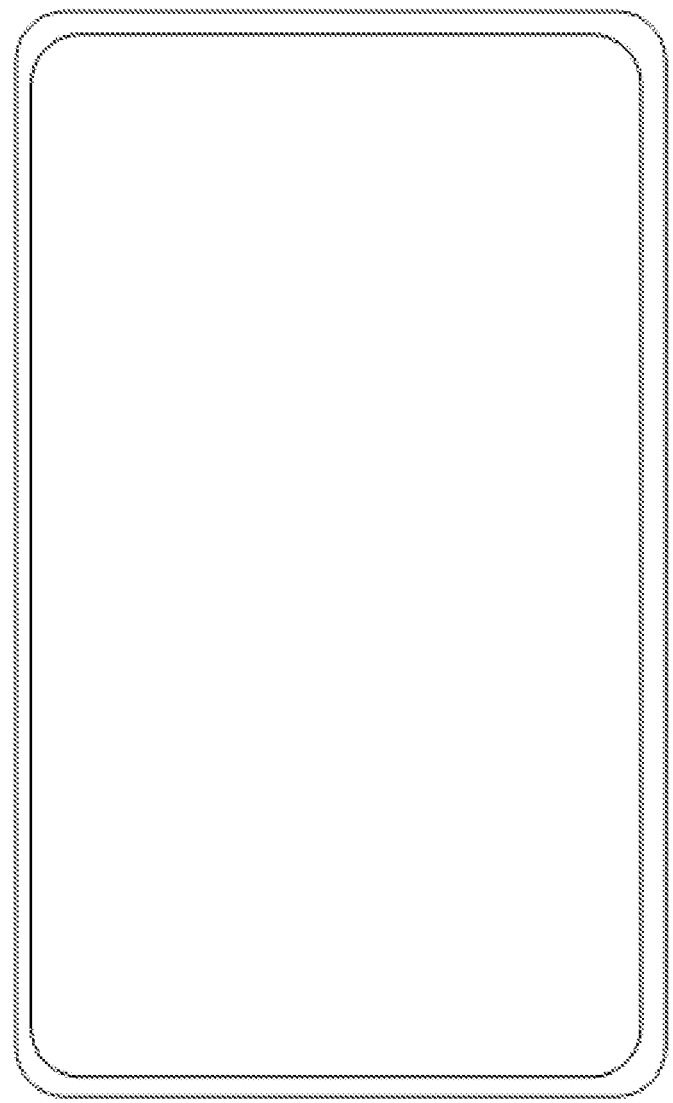
FIG. 13 is a structural schematic diagram of a display device provided by embodiments of the present disclosure.

During specific implementation, the display device provided by the embodiments of the present disclosure may be a full-screen mobile phone shown in FIG. 13. Certainly, the display device provided by the embodiments of the present disclosure may also be a tablet personal computer, a TV, a display, a laptop, a digital photo frame, a navigator or any other product or component having a display function. Other essential constituent parts of the display device are all parts that shall be understood by those ordinary skilled in the art to have. Unnecessary details are not given herein. The other essential constituent parts shall not serve as limitations of the present disclosure.

According to the array substrate and the manufacturing method thereof, the display panel and the display device provided by the embodiments of the present disclosure, the shielding structure which is mutually insulated from the first metal layer and the second metal layer is arranged between the first metal layer and the second metal layer, and the shielding structure is coupled to the fixed potential, so that the parasitic capacitance between the luminous control signal line and the anode overlap electrode can be decreased or eliminated; and the voltage change of the anode electrically connected with the anode overlap electrode can be avoided, thereby increasing the color display uniformity.

Although the preferred embodiments of the present disclosure have been described, once the basic creative concept is known by those skilled in the art, additional changes and modifications may be made to these embodiments. Therefore, the claims are intended to be explained to include the preferred embodiments and all the changes and modifications falling within the scope of the present disclosure.

Apparently, various modifications and variations may be made to the embodiments of the present disclosure by those skilled in the art without departing from the spirit and scope of the embodiments of the present disclosure. Thus, if these modifications and variations of the embodiments of the present disclosure are within the scope of the claims of the present disclosure and equivalent technologies thereof, the present disclosure is also intended to be included in these modifications and variations.

What is claimed is:

1. An array substrate, comprising:
a substrate;
a first metal layer, arranged on the substrate and comprising a luminous control signal line;
a second metal layer, arranged on one side, departing from the substrate of the first metal layer and comprising an anode overlap electrode; wherein the anode overlap electrode and the luminous control signal line have a first overlapping area; and
a shielding structure, arranged between the first metal layer and the second metal layer and mutually insulated from the first metal layer and the second metal layer;
wherein an orthographic projection of the shielding structure on the substrate at least partially covers an orthographic projection of the first overlapping area on the substrate; and
the shielding structure is coupled to a fixed potential;
wherein the array substrate further comprises: a third metal layer arranged between the first metal layer and the second metal layer; wherein the shielding structure is arranged on the third metal layer;
wherein the second metal layer further comprises a drive voltage signal line; the third metal layer comprises a capacitor plate electrically connected with the drive voltage signal line; and the shielding structure and the capacitor plate are an integral structure;
or,
wherein the third metal layer further comprises an initialization signal line; and the shielding structure and the initialization signal line are an integral structure.

2. The array substrate according to claim 1, wherein an area of the orthographic projection of the shielding structure on the substrate is 50% greater than an area of the orthographic projection of the first overlapping area on the substrate.

3. The array substrate according to claim 1, wherein the second metal layer further comprises a data signal line parallel to the drive voltage signal line;
the capacitor plate and the data signal line have a second overlapping area; and
along an extension direction of the data signal line, a width of the second overlapping area is smaller than that of a part where the capacitor plate and the data signal line do not overlap.

4. The array substrate according to claim 1, further comprising:
an insulating layer arranged on one side, departing from the substrate, of the second metal layer; and
an anode arranged on one side, departing from the substrate, of the insulating layer;
wherein the anode is electrically connected with the anode overlap electrode by penetrating through a via hole of the insulating layer.

5. The array substrate according to claim 4, wherein the anode and the anode overlap electrode have a third overlapping area, and
the third overlapping area is a chamfering structure.

6. The array substrate according to claim 1, wherein the second metal layer further comprises a drive voltage signal line;
the third metal layer comprises: an initialization signal line, and a capacitor plate electrically connected with the drive voltage signal line;

the initialization signal line and the luminous control signal line have a same extension direction;
extension directions of the drive voltage signal line and the luminous control signal line cross with each other;
the array substrate has a plurality of sub-pixel regions; and
each of the plurality of sub-pixel regions comprises:
a first luminous control transistor and a second luminous control transistor which are electrically connected with the luminous control signal line, and
a first initialization transistor and a second initialization transistor which are electrically connected with the initialization signal line;
wherein both the second luminous control transistor and the second initialization transistor are electrically connected with the anode overlap electrode.

7. The array substrate according to claim 6, wherein each of the plurality of sub-pixel regions further comprises: a first data write transistor, a second data write transistor, a drive transistor and a storage capacitor;
wherein a gate of the first data write transistor and a gate of the second data write transistor are both electrically connected with a first scanning line; a first electrode of the first data write transistor is electrically connected with a data signal line; a second electrode of the first data write transistor is electrically connected with a first electrode of the drive transistor;
a first electrode of the second data write transistor is electrically connected with a gate of the drive transistor; a second electrode of the second data write transistor is electrically connected with a second electrode of the drive transistor;
a first electrode of the storage capacitor is the capacitor plate; a second electrode of the storage capacitor is electrically connected with the gate of the drive transistor;
a gate of the first luminous control transistor is electrically connected with the luminous control signal line; a first electrode of the first luminous control transistor is electrically connected with the drive voltage signal line; a second electrode of the first luminous control transistor is electrically connected with the first electrode of the drive transistor;
a gate of the second luminous control transistor is electrically connected with the luminous control signal line; a first electrode of the second luminous control transistor is electrically connected with the second electrode of the drive transistor; a second electrode of the second luminous control transistor is electrically connected with the anode overlap electrode;
a gate of the first initialization transistor is electrically connected with a second scanning line; a first electrode of the first initialization transistor is electrically connected with the initialization signal line; a second electrode of the first initialization transistor is electrically connected with the gate of the drive transistor; and
a gate of the second initialization transistor is electrically connected with the second scanning line; a first electrode of the second initialization transistor is electrically connected with the initialization signal line; and a second electrode of the second initialization transistor is electrically connected with the anode overlap electrode.

8. A display panel, comprising the array substrate according to claim 1.

9. A display device, comprising the display panel according to claim 8.

10. A method for manufacturing the array substrate according to claim 1, comprising:
- forming the first metal layer on the substrate; wherein the first metal layer comprises the luminous control signal line;
- forming the shielding structure on the substrate where the first metal layer is formed; wherein the shielding structure is mutually insulated from the first metal layer and coupled to the fixed potential; and
- forming the second metal layer on the substrate where the shielding structure is formed;
- wherein the shielding structure is mutually insulated from the second metal layer; the second metal layer comprises the anode overlap electrode; the anode overlap electrode and the luminous control signal line have the first overlapping area; and the orthographic projection of the shielding structure on the substrate at least covers the orthographic projection of the first overlapping area on the substrate.

11. The method according to claim 10, further comprising:
- forming the drive voltage signal line on the second metal layer;
- forming the third metal layer on one side, departing from the substrate, of the first metal layer before the second metal layer is formed; wherein the third metal layer comprises the capacitor plate electrically connected with the drive voltage signal line; and
- forming the capacitor plate and the shielding structure by a single mask patterning process.

12. The method according to claim 10, further comprising:
- forming the third metal layer on one side, departing from the substrate, of the first metal layer before the second metal layer is formed; wherein the third metal layer comprises the initialization signal line; and
- forming the initialization signal line and the shielding structure by a single mask patterning process.

* * * * *